US005653070A

United States Patent [19]

Seguin

[11] Patent Number: 5,653,070

[45] Date of Patent: Aug. 5, 1997

[54] SELF-STABILIZING SYSTEM FOR RACK-MOUNTING EQUIPMENT

[76] Inventor: Serge Seguin, 25 Old Farms Rd., Woodcliff Lake, N.J. 07675

[21] Appl. No.: 599,496

[22] Filed: Jan. 24, 1996

[51] Int. Cl.[6] .................................................. E04B 1/36

[52] U.S. Cl. ..................... 52/167.1; 52/167.4; 52/167.7; 52/167.9; 248/621; 248/623; 248/638; 312/351.7; 312/352

[58] Field of Search .............................. 52/167.9, 167.8, 52/167.7, 167.4, 167.1; 248/616, 618, 619, 621, 623, 624, 615, 638; 211/26; 312/351.1, 351.7, 352

[56] References Cited

U.S. PATENT DOCUMENTS

| | | | |
|---|---|---|---|
| 2,173,342 | 9/1939 | Rosenzweig | 248/624 |
| 2,597,800 | 5/1952 | Hussman | 52/167.7 X |
| 2,687,270 | 8/1954 | Robinson | 248/624 X |
| 2,904,302 | 9/1959 | Cavanaugh et al. | 248/624 |
| 4,251,045 | 2/1981 | Meyerle | 248/619 |
| 5,156,451 | 10/1992 | Pollock | 248/616 X |

*Primary Examiner*—Christopher Todd Kent
*Attorney, Agent, or Firm*—Michael Ebert

[57] ABSTRACT

A self-stabilizing system to protect sensitive equipment housed in a rack from shock forces emanating from the structure or foundation on which the rack is placed. The system includes a chassis restable on the foundation having an array of four vertical shafts anchored thereon. These shafts extend through bearings fitted in vertical ducts incorporated in the four corners of the rack whereby the rack is slidable on the shafts. Springs interposed between the base of the rack and the chassis or between the top of each shaft and the upper end of the duct in which the shaft is received, act to resiliently support the rack on the chassis and thereby attenuate the shock forces. Secured to the underside of the rack to raise it above the foundation are isolators whose stiffness characteristics are such as to resist rotational motion and to permit lateral motion.

9 Claims, 2 Drawing Sheets

SELF-STABILIZING SYSTEM FOR RACK-MOUNTING EQUIPMENT

BACKGROUND OF INVENTION

1. Field of Invention

This invention relates generally to a stabilizer system for cabinet or rack-mounted sensitive equipment which serves effectively to isolate the unit from shock and vibratory forces, and more particularly to a system which is self-stabilizing and therefore need not be affixed to the structure adjacent to the foundation on which the cabinet or rack is installed.

2. Status of Prior Art

When sensitive equipment such as electronic systems, communication units, digital computers and delicate machines are installed and operated in an environment which subjects the equipment to shock and vibratory forces, these forces may impair the equipment or interfere with its proper functioning. It is, therefore, necessary to so mount the equipment as the effectively isolate it from these adverse forces.

Thus in U.S. Pat. No. 804,884 to Rutan, a machine to be protected is mounted on a chassis that floats within a frame. This is achieved by vertical springs interposed between the underside and upperside of the chassis and the base wall and top wall of the frame, respectively, and by lateral springs interposed between opposite edges of the chassis and the corresponding side walls of the frame. The floating machine is thereby effectively isolated from the shock and vibratory forces to which the frame is subjected.

The Bennett U.S. Pat. No. 2,145,037 shows a radio cabinet having at each of its corners a cylindrical duct in which is received a spring-loaded cushion that rests on a floor subjected to shock forces, thereby isolating the radio from these forces.

In the Meyerle U.S. Pat. No. 4,251,045, a turntable chassis is supported by springs within a cabinet that rests on a platform supported above ground by resilient pads. The Scotto U.S. Pat. No. 3,459,395 discloses shock-sensitive equipment mounted on a platform having four shock absorbers at its corners supporting the platform within the hull of boat.

Thus the use of springs and resilient pads is a common expedient for the protection of sensitive equipment from shock and vibratory forces.

The concern of the present invention is with the requirements imposed by Army, Navy and Air Force agencies for protecting rack or cabinet-mounted electronic equipment, computer system and communication units against shock and vibratory forces. These requirements are more stringent than those imposed on equipment which is installed in environments which experience lesser shock and vibratory forces, for in military environments one can encounter intense forces.

The protection of a unit within itself or between the unit and the rack or cabinet in which it is mounted is usually inadequate when the shock and vibratory forces to which the unit is subjected are intense. It is therefore the common practice to mount the whole rack or cabinet on resilient elements that absorb or attenuate these forces. Attenuation or dampening of shock and vibratory forces is obtained by deflection of the resilient elements which acts to absorb the forces to then release them over a longer period of time and thereby isolate the unit from the forces.

However, when the cabinet or rack in which the sensitive equipment is housed is tall, then stabilizers are needed, otherwise the excursion of the rack at its top due to rotational motion would be excessive and unacceptable. The conventional technique for effecting such stabilization is to have a set of mounts at the top or toward the top of the rack or cabinet.

The drawback to this mode of stabilization is that one then needs to affix the stabilizer mounts to the existing superstructure which in a shipboard installation is decking or a bulkhead. In some instances there is no place close enough to which the stabilizer mounts can be connected. In other cases, the cost of adjusting or modifying the structure to render it suitable for affixing stabilizer mounts thereto may be prohibitive.

As used herein, the term rack is to be understood to mean not only a framework on which sensitive equipment is mounted, but also a console, a cabinet or any other housing containing the equipment. And the term shock forces, as used herein, is to be understood to mean not only sudden impact forces, but also sutained vibratory forces.

When therefore a rack is shock-mounted it is protected against whatever forces seek to shock the sensitive equipment housed in the rack.

SUMMARY OF INVENTION

In view of the foregoing the main object of this invention is to provide a stabilizer system for protecting rack-mounted sensitive equipment from shock forces, the system being self-stabilizing and therefore need not be affixed to the structure or foundation on which the rack is installed.

More particularly an object of this invention is to provide a self-stabilizing system of the above type which is effective for a tall rack and resists forces seeking to rotate rack.

As an object of this invention is to provide a self-stabilizing system that acts to resiliently support the rack on an array of vertical shafts anchored on a chassis on which the rack is slidable whereby shock forces emanating from the structure or foundation on which the rack is installed are not fully transferred to equipment contained in the rack even when these forces are intense.

Briefly stated, these objects are attained by a self-stabilizing system adapted to protect sensitive equipment housed in a rack from shock forces emanating from the foundation on which the rack is placed. The system includes a chassis restable on the foundation having four vertical shafts anchored thereon. These shafts extend through bearings fitted in vertical ducts incorporated in the four corners of the rack whereby the rack is slidable on the shafts. Springs interposed between the base of the rack and the chassis or between the top of each shaft and the upper end of the duct in which the shaft is received act to resiliently support the rack on the chassis and thereby attenuate the shock forces. Secured to the underside of the rack to raise it above the foundation are isolator pads whose stiffness characteristics are such as to resist rotational motion and to permit lateral motion.

BRIEF DESCRIPTION OF DRAWINGS

For a better understanding of the invention as well as other objects and further features thereof, reference is made to the following detailed description to be read in conjunction with the accompanying drawings, wherein.

DESCRIPTION OF INVENTION

Figure 1:
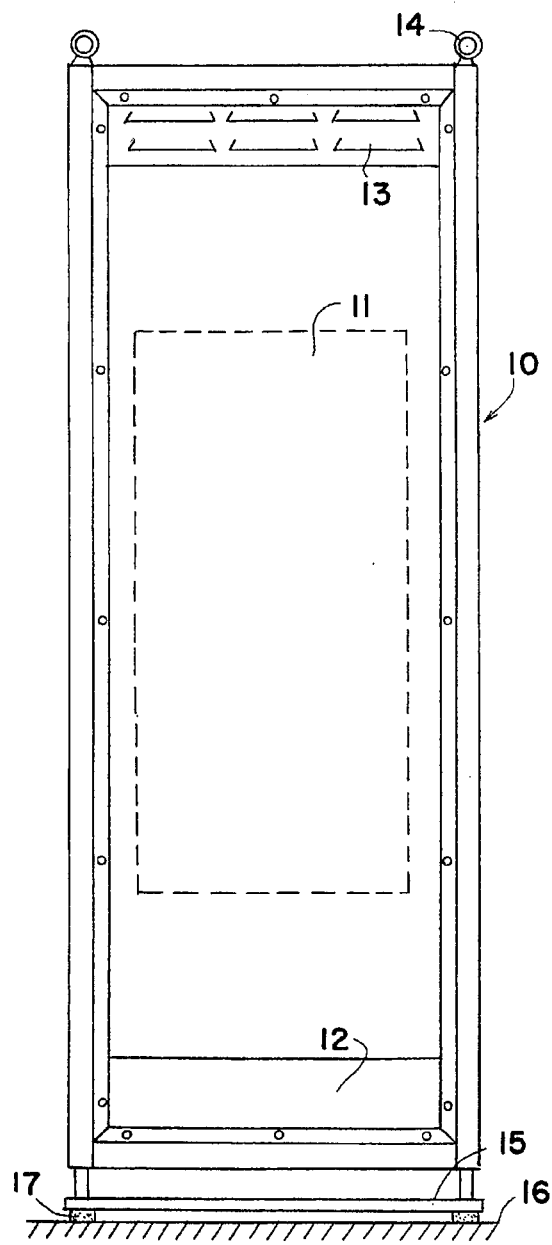
FIG. 1 is a front view of a rack having sensitive equipment mounted thereon, the rack being protected against shock forces by a stabilizer system in accordance with the invention.
Figure 2:
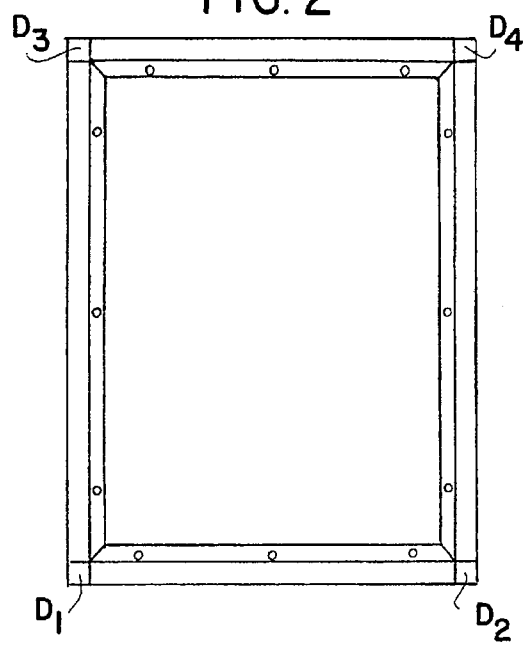
FIG. 2 is a top view of the rack.
Figure 3:
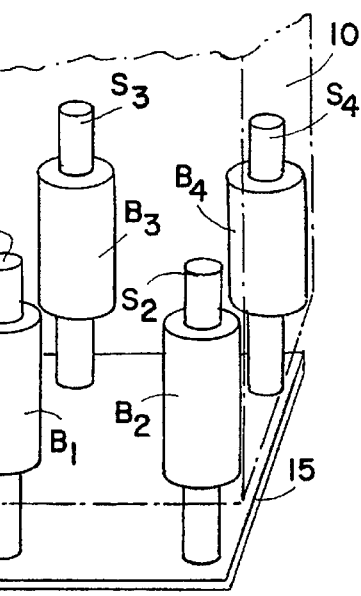
FIG. 3 schematically shows the chassis on which the rack is slidably mounted.
Figure 4:
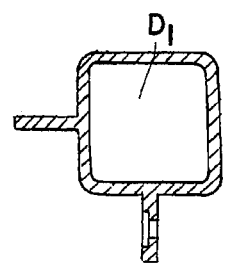
FIG. 4 is a transverse section taken through one of the ducts incorporated in the rack.
Figure 5:
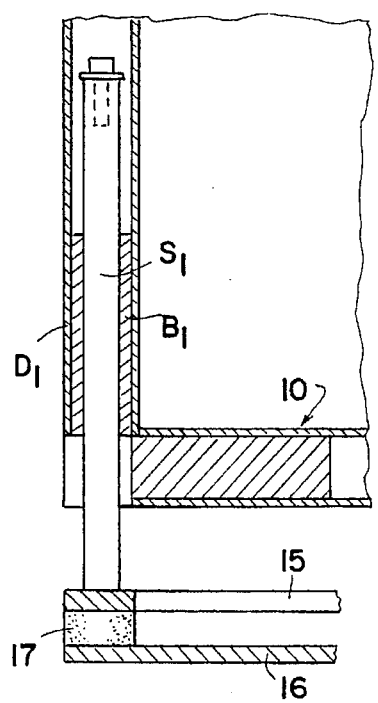
FIG. 5 is a longitudinal section taken through one of the corner ducts in the rack, showing the shaft extending therethrough.

FIGS. 1 to 5 show a tall, generally rectangular rack 10 housing sensitive equipment 11 such as a communication unit. To keep the unit cool and in good operating condition the rack is provided at its lower end with a front-mounted impeller blower 12, and at its upper end with a front-mounted air intake and filter 13. The rack is also provided at its top end with eyebolts 14 so that the rack can be readily hoisted to a desired site. As pointed out previously, the term rack is generic to any structure housing the unit.

The rack is supported on a chassis 15 which is raised above a foundation 16 by isolater pads 17 whose function will later be explained. Rack 10 includes a rectangular outer frame whose four corners incorporate ducts $D_1$ to $D_4$ having a square cross section. Fitted into the lower end of the ducts are low friction bearings $B_1$ to $B_4$.

In practice the bearings may be made of UHMW (ultrahigh molecular weight polyethylene) having a very low coefficient of sliding friction. The bearings may be molded to have a square cross section so that each bearing fits snugly into a respective duct ($D_1$ to $D_4$), each bearing having a cylindrical bore to slidable receive a cylindrical post or shaft of substantially the same diameter.

Anchored at the corners of chassis 12 are four vertical shafts $S_1$ to $S_4$ which extend through corresponding bearings $B_1$ to $B_4$ fitted into the lower ends of ducts $D_1$ to $D_4$. Hence rack 10 is slidable along the vertical axes of the anchored shafts.

In order that the rack be resiliently mounted on chassis 15 so that the rack effectively floats thereon, various spring arrangements are useable to this end. The arrangements are shown schematically in FIGS. 6, 7 and 8.

Figure 6:
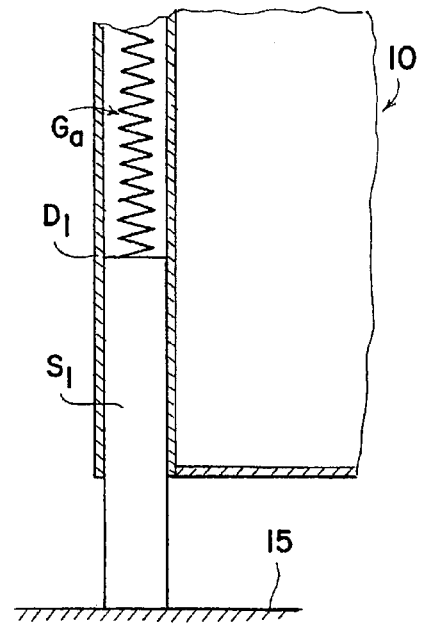
FIG. 6 schematically shows a spring arrangement associated with a duct shaft.

In the FIG. 6 arrangement which is illustrated only in connection with duct $D_1$, interposed between the upper end of this duct and the top of shaft $S_1$ extending therein fact is a helical compression spring $G_a$. A like spring arrangement is included in ducts $D_2$ to $D_4$; hence rack 10 is resiliently supported on chassis 15. The rack, as it reciprocates a is slidable on the array of shafts $S_1$ to $S_4$.

As a consequence, vibratory or shock forces transmitted to chassis 15 from foundation 16 are transferred to the shafts $D_1$ to $D_4$. But because of the resilient coupling between these shafts and the rack, the shock forces are absorbed and dampened by the springs which effectively float the rack.

Figure 7:
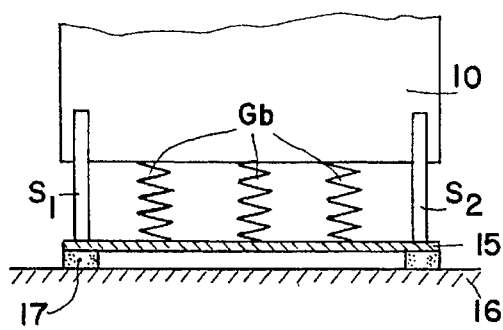
FIG. 7 shows one underside spring arrangement for resiliently supporting the rack.

In the spring arrangement shown in FIG. 7, instead of spring-loading the shafts, the rack itself is spring-loaded by a set of helical springs $G_b$ interposed between the base of rack 10 and the chassis 15, thereby floating the rack on the chassis.

Figure 8:
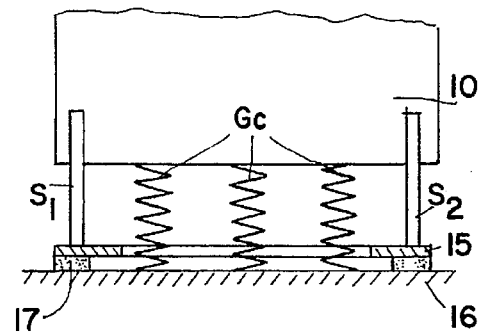
FIG. 8 shows another underside spring arrangement for resiliently supporting the rack.

In the spring arrangement shown in FIG. 8, the rack is caused to float on foundation 17 by a set of helical springs, $G_c$ interposed between the base of the rack and foundation 17, the springs going through openings in chassis 15.

In order to attenuate lateral shock and vibratory forces, or shock forces having a lateral component, and thereby reduce the amount of stress imposed on the shafts, the system should have limited freedom to move laterally which maintaining rotational stability. This condition is obtained by anchoring the four shafts on the same rigid chassis 15 while may be fabricated of steel, and supporting the chassis on isolators 17 whose vertical-to-lateral stiffness ratio is such that the isolators are "hard" in rotation, but "soft" in lateral motion.

Figure 9:
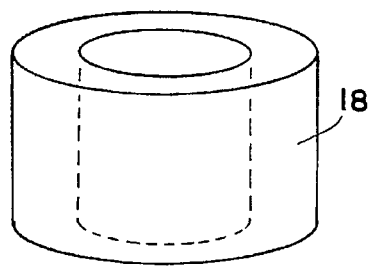
FIG. 9 shows a preferred embodiment of an isolator element in the unloaded state.
Figure 10:
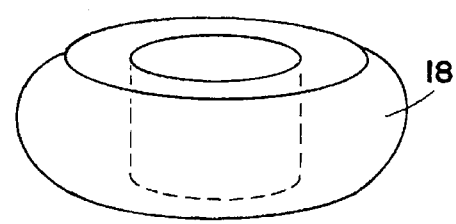
FIG. 10 shows the isolator element in a loaded state.

The isolators may take the form of pads fabricated of fibrous material having the desired stiffness characteristics, the isolators, as shown in FIGS. 9 and 10, may take the form of a hollow cylindrical column 18 of elastomeric material, such as high-density resilient foam and material which is highly resistant to rotary motion, but has lateral softness so that, as shown in FIG. 10, the column bulges out when loaded. Thus the isolators allow for lateral motion, but are stiff in the vertical direction and in rotation to resist rotation of the rack.

While there has been shown preferred embodiments of a stabilizer system in accordance with the invention, it will be appreciated that many changes may be made therein without departing from the spirit of the invention.

I claim:

1. A self-stabilizing system adapted to protect sensitive equipment housed in a four-cornered rack from shock forces emanating from a foundation on which the rack is placed, said system comprising:

A. a rectangular rack having a base and having incorporated in each corner therein a vertical duct extending upwardly from the base in which is fitted a bearing adapted to receive a shaft;

B. a chassis restable on the foundation on which the rack is placed;

C. a set of four vertical shafts anchored on the chassis and extending into the respective ducts in the rack through the bearings therein whereby the rack is slidable on the shafts; and D. spring means resiliently supporting the rack slidable on the shafts anchored on the chassis whereby the rack effectively floats on the chassis and said forces are attenuated by the spring means.

2. A system as set forth in claim 1, in which the spring means include a set of four springs, each interposed between a respective shaft in said set of shafts and an upper end of the duct through which the shaft extends.

3. A system as set forth in claim 2, in which each spring is compressible helical spring.

4. A system as set forth, in claim 1, in which the spring means are constituted by at least one spring interposed between the base of the rack and the chassis.

5. A system as set forth in claim 1, in which the spring means are constituted by at least one spring interposed between the base of the rack and the foundation on which the rack is placed.

6. A system as set forth in claim 1, in which the duct has a square cross section and said bearing is formed of UHMW polyethylene.

7. A system as set forth in claim 1, in which said chassis is provided with vibration isolators which raise the chassis above the foundation.

8. A system as set forth in claim 7, in which the isolators have stiffness characteristics so as to resist rotational motion and to permit lateral motion.

9. A system as set forth in claim 8, in which the isolators are each formed by a hollow cylinder of resilient foam plastic material.

* * * * *